United States Patent
Kamitani

(10) Patent No.: US 6,919,733 B2
(45) Date of Patent: Jul. 19, 2005

(54) ELECTRONIC COMPONENT PRODUCTION METHOD AND BURN-IN APPARATUS

(75) Inventor: Gaku Kamitani, Kyoto (JP)

(73) Assignee: Murata Manufacturing Co., Ltd. (JP)

( * ) Notice: Subject to any disclaimer, the term of this patent is extended or adjusted under 35 U.S.C. 154(b) by 132 days.

(21) Appl. No.: 10/649,845

(22) Filed: Aug. 26, 2003

(65) Prior Publication Data

US 2004/0052025 A1 Mar. 18, 2004

(30) Foreign Application Priority Data

Sep. 18, 2002 (JP) ........................................ 2002-271350

(51) Int. Cl.$^7$ ............................................. G01R 31/02
(52) U.S. Cl. .................................... 324/760; 324/765
(58) Field of Search ............................... 324/73.1, 754, 324/760, 765, 158.1; 219/200, 209

(56) References Cited

U.S. PATENT DOCUMENTS 3,745,460 A * 7/1973 Belzer et al. ................ 324/765
5,473,259 A * 12/1995 Takeda ........................ 324/760
6,574,763 B1 * 6/2003 Bertin et al. .................. 714/38

FOREIGN PATENT DOCUMENTS

| JP | 6-102312 | 4/1994 |
|---|---|---|
| JP | 2000-164471 | 6/2000 |
| JP | 2000-208380 | 7/2000 |

* cited by examiner

Primary Examiner—Minh N. Tang
(74) Attorney, Agent, or Firm—Ostrolenk, Faber, Gerb & Soffen, LLP

(57) ABSTRACT

An electronic component production method for subjecting an electronic component to burn-in, in which a load equivalent to a predetermined load defined by a burn-in temperature, a burn-in voltage, and a burn-in time is applied to the electronic component, includes a first step of setting the temperature of the electronic component to a predetermined temperature which is lower than the burn-in temperature; a second step of applying constant power to the electronic component to increase the temperature of the electronic component from the predetermined temperature to the burn-in temperature; and a third step of comparing an actual voltage which is applied to the electronic component at the burn-in temperature with the burn-in voltage and correcting the burn-in time based on the difference therebetween to determine a corrected burn-in time, and applying the constant power to the electronic component for the corrected burn-in time.

12 Claims, 9 Drawing Sheets

ELECTRONIC COMPONENT PRODUCTION METHOD AND BURN-IN APPARATUS

BACKGROUND OF THE INVENTION

1. Field of the Invention

The present invention relates to a method of producing multilayer ceramic capacitors or other electronic components using high-dielectric-constant ceramics, and to a burn-in apparatus.

2. Description of the Related Art

Such electronic components must be tested in various ways including burn-in tests before they are shipped. As known in the art, in burn-in tests, predetermined loads are placed on the electronic components in order to screen the electronic components. More specifically, a constant voltage (burn-in voltage) more than a rated voltage is applied to the electronic components at a constant temperature (burn-in temperature) more than a rated temperature for a predetermined short time (burn-in time), and their insulation resistance is measured. The electronic components whose insulation resistance is lower than a predetermined value are rejected.

When a burn-in voltage is applied to an electronic component at a burn-in temperature, the electronic component is self-heated due to a load current, and actually the burn-in temperature defined by a thermostatic oven is not maintained. The self-heating temperature itself differs from one electronic component to another.

One burn-in method of the related art, which provides accurate burn-in while maintaining the self-heating temperature of electronic components constant, applies constant power (for example, Japanese Unexamined Patent Application Publication No. 6-102312 (page 4, FIG. 3)).

This related-art burn-in method is suitable for an electronic component whose consumption power can be precisely controlled based on an external control signal, but is not suitable for an electronic component, such as a capacitor, whose consumption power cannot be precisely controlled based on an external control signal alone.

SUMMARY OF THE INVENTION

Accordingly, the present invention provides a method for applying a predetermined load to any electronic component while its self-heating temperature is maintained constant.

In one aspect of the present invention, an electronic component production method for subjecting an electronic component to burn-in, in which a load equivalent to a predetermined load defined by a burn-in temperature, a burn-in voltage, and a burn-in time is applied to the electronic component, includes a first step of setting the temperature of the electronic component to a predetermined temperature which is lower than the burn-in temperature; a second step of applying constant power to the electronic component to increase the temperature of the electronic component from the predetermined temperature to the burn-in temperature; and a third step of comparing an actual voltage which is applied to the electronic component at the burn-in temperature with the burn-in voltage, and correcting the burn-in time based on the difference therebetween to determine a corrected burn-in time, and applying the constant power to the electronic component for the corrected burn-in time.

According to the present invention, in the first step, the electronic component is heated to the predetermined temperature. At this time, no power is applied to the electronic component. In the second step, constant power is applied to the electronic component to increase the temperature of the electronic component from the predetermined temperature to the burn-in temperature. Although the electronic component is self-heated due to the applied constant power, the temperature of the electronic component is controlled at the burn-in temperature. In the third step, the burn-in time is corrected based on the difference between the actual voltage applied and the burn-in voltage, thereby controlling the total load to meet the desirable burn-in conditions. Consequently, the electronic component is subjected to burn-in under equivalent burn-in conditions, resulting in an accurate burn-in test.

Preferably, in the third step, the corrected burn-in time is given by [(the burn-in voltage)$^A$/(the actual voltage)$^A$]×the burn-in time, where A is a constant. A more accurate load is applied to the electronic component, resulting in a more accurate burn-in test. In the above formula, A denotes the acceleration factor indicating how the load applied to the electronic component increases depending upon voltage, and is determined using a life test or the like.

Preferably, in the second step, the constant power is applied to the electronic component via a probing unit having known thermal resistance, and the applied constant power is defined so that the difference between the burn-in temperature and the predetermined temperature matches the product of the thermal resistance and the constant power.

In another aspect of the present invention, a burn-in apparatus for subjecting an electronic component to burn-in, in which a load equivalent to a predetermined load defined by a burn-in temperature, a burn-in voltage, and a burn-in time is applied to the electronic component, includes a constant-power applying unit for applying constant power to the electronic component; and a burn-in control unit for controlling the operation of the constant-power applying unit, wherein the burn-in control unit executes at least a first control step and a second control step. In the first control step, the burn-in control unit drives the constant-power applying unit to apply the constant power to the electronic component to increase the temperature of the electronic component from a predetermined temperature to the burn-in temperature. In the second control step, the burn-in control unit compares an actual voltage which is applied to the electronic component at the burn-in temperature with the burn-in voltage and corrects the burn-in time based on the difference therebetween, so that the electronic component is subjected to burn-in at the burn-in temperature for the corrected burn-in time.

According to the present invention, in the first control step, the burn-in controller causes the constant power to be applied to the electronic component to increase the temperature of the electronic component from a predetermined temperature to the burn-in temperature. The temperature of the electronic component is controlled at the burn-in temperature. In the second control step, the burn-in time is corrected based on the difference between the actual voltage applied to the electronic component and the burn-in voltage, thereby controlling the total load to meet the desirable burn-in conditions. Consequently, the electronic component is subjected to burn-in under equivalent burn-in conditions, resulting in an accurate burn-in test.

Preferably, the burn-in apparatus of the present invention further includes a probing unit having known thermal resistance, and the constant power is applied to the electronic component via the probing unit. Preferably, the applied constant power is defined so that the difference between the burn-in temperature and the predetermined temperature matches the product of the thermal resistance and the constant power.

Preferably, in the second control step, the burn-in control unit calculates [(the burn-in voltage)$^A$/(the actual voltage)$^A$]×the burn-in time, where A is a constant, to determine the corrected burn-in time, and the electronic component is subjected to burn-in for the corrected burn-in time. In the above formula, A denotes the acceleration factor indicating how the load applied to the electronic component increases depending upon voltage, and is determined using a life test or the like.

Other features and advantages of the present invention will become apparent from the following description of embodiments of the invention which refers to the accompanying drawings.

DESCRIPTION OF EMBODIMENTS OF THE INVENTION

The detailed description of the present invention is given below with reference to the drawings taken in conjunction with the preferred embodiments.

Figure 1:
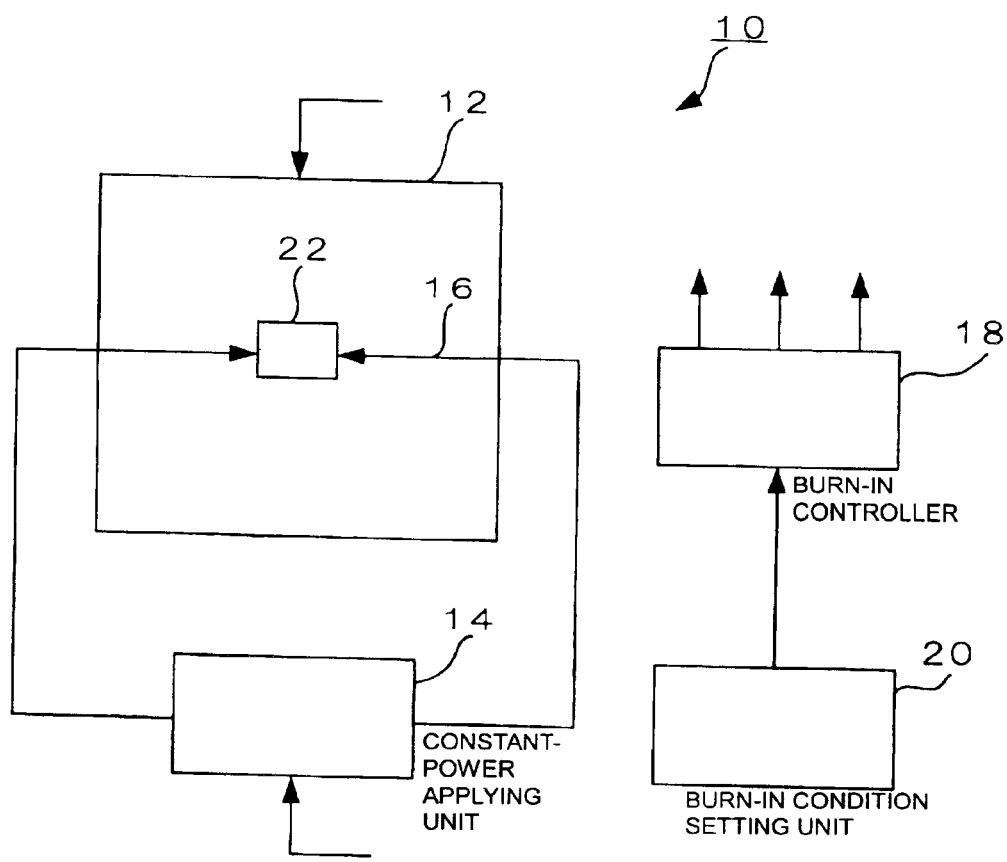
FIG. 1 is a block diagram of a burn-in apparatus for performing an electronic component production method according to an embodiment of the present invention.
Figure 2:
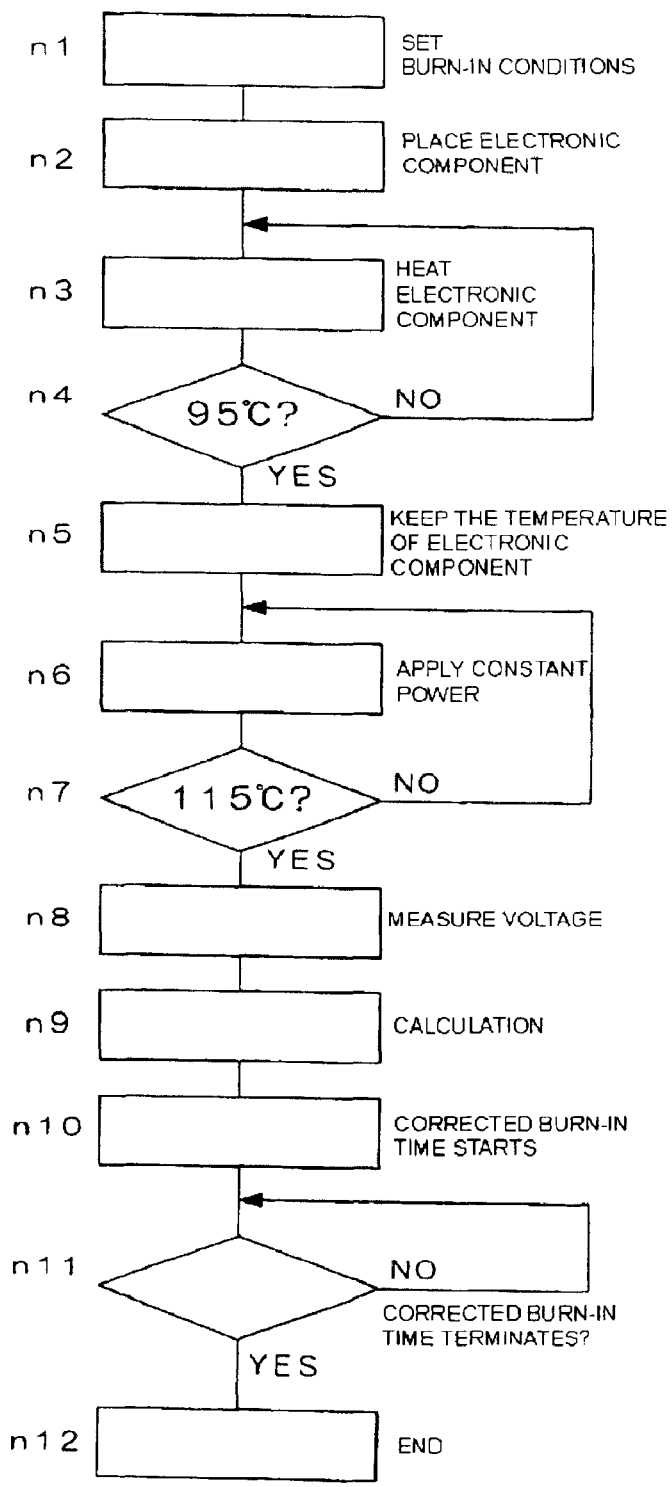
FIG. 2 is a flowchart showing the operation of the burn-in apparatus shown in FIG. 1.
Figure 3:
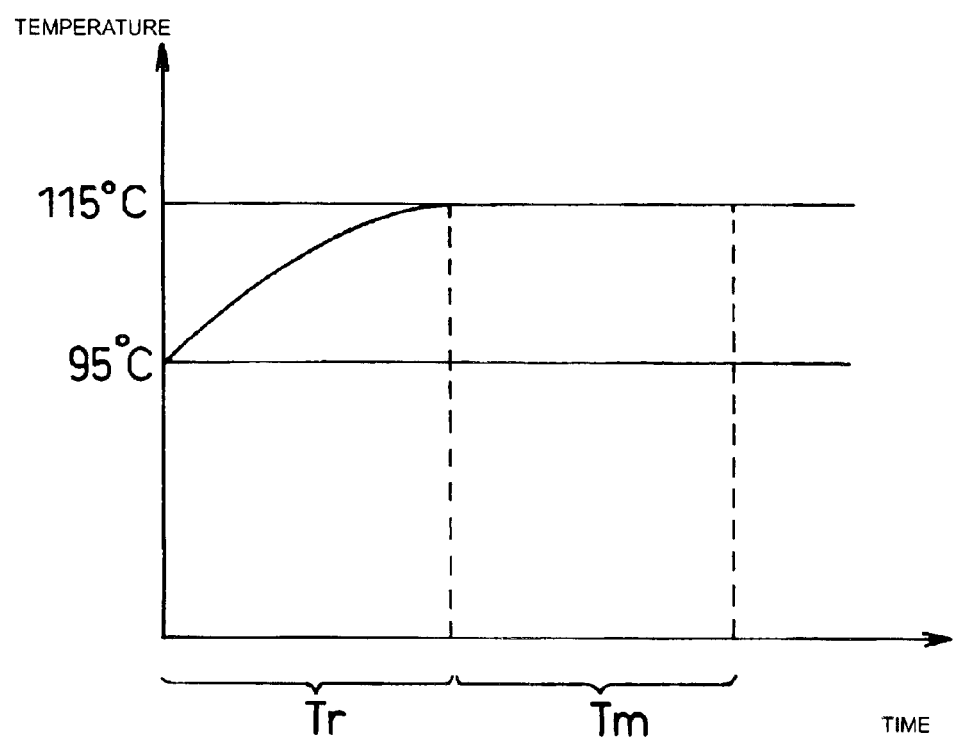
FIG. 3 is a graph showing a change in temperature of an electronic component in the burn-in apparatus shown in FIG. 1.
Figure 4:
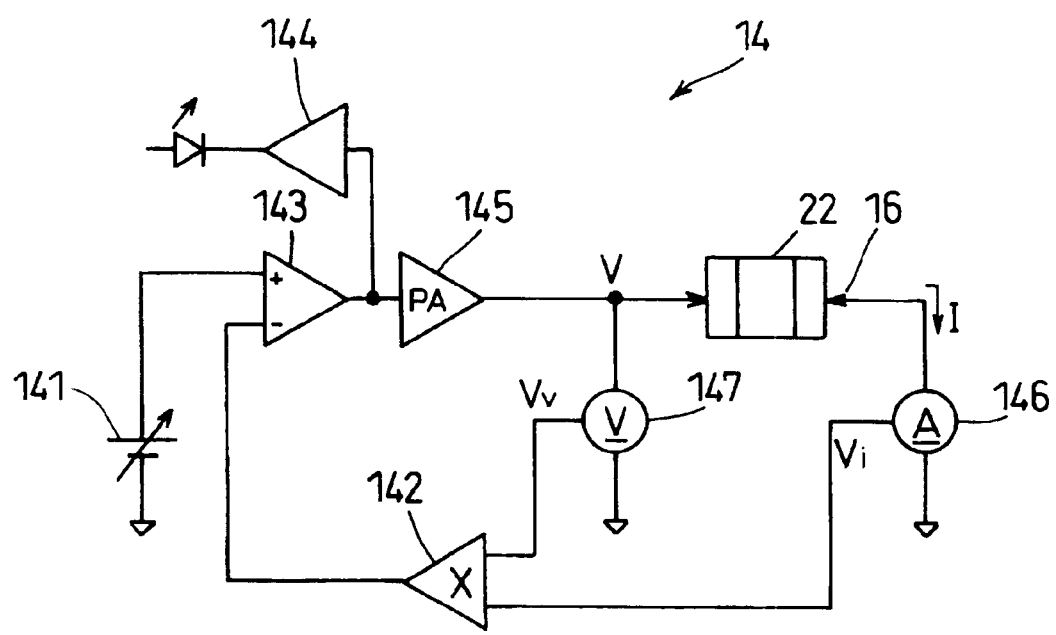
FIG. 4 is a circuit diagram of an example of the constant-power applying unit shown in FIG. 1.
Figure 5:
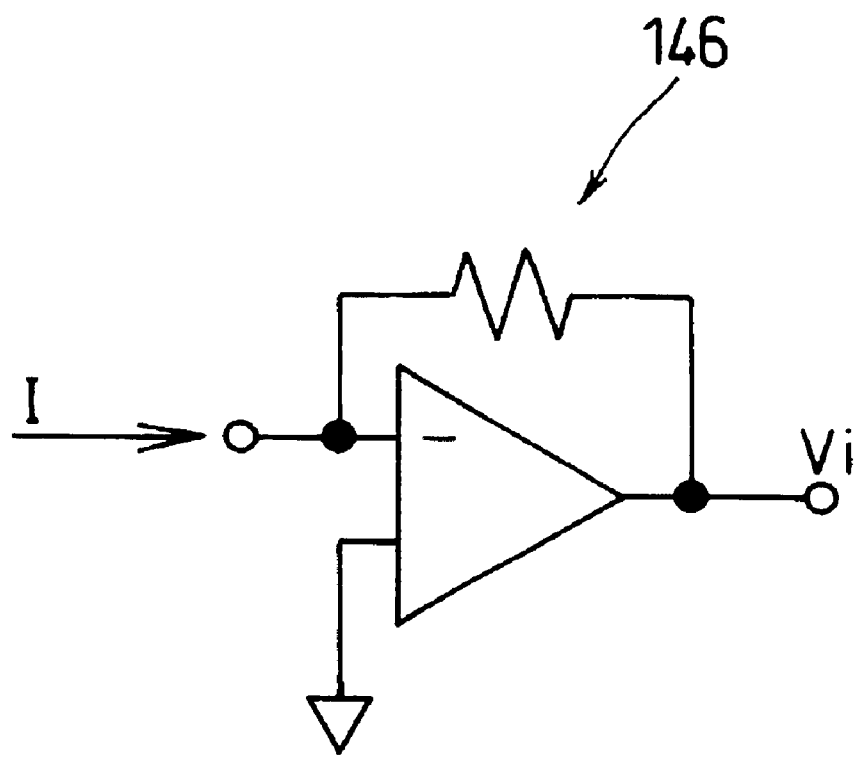
FIG. 5 is a circuit diagram of an example of the current detector shown in FIG. 4.
Figure 6:
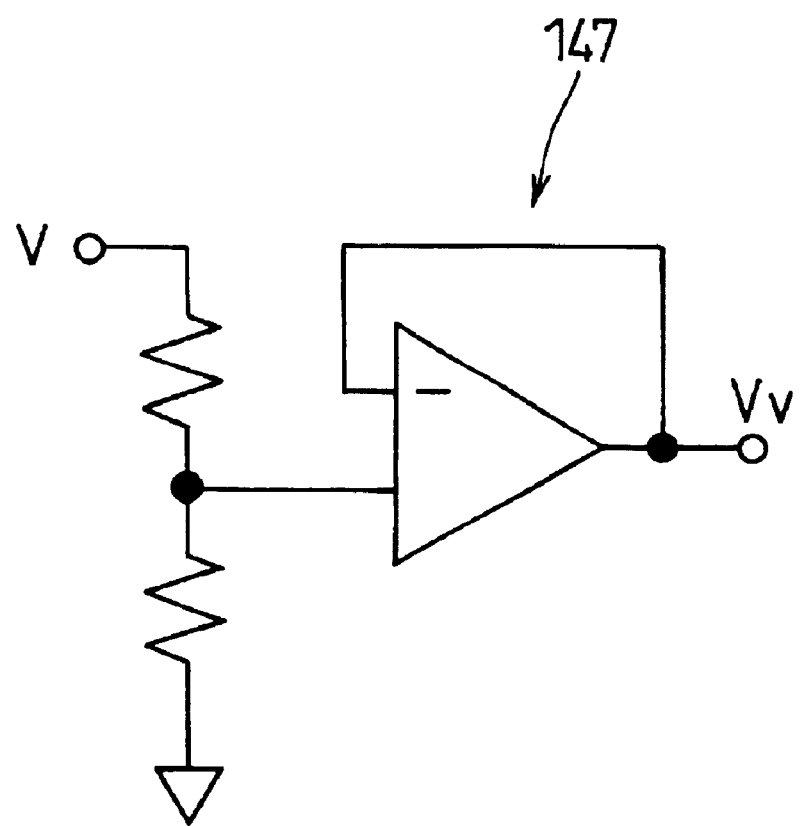
FIG. 6 is a circuit diagram of an example of the voltage detector shown in FIG. 4.
Figure 7:
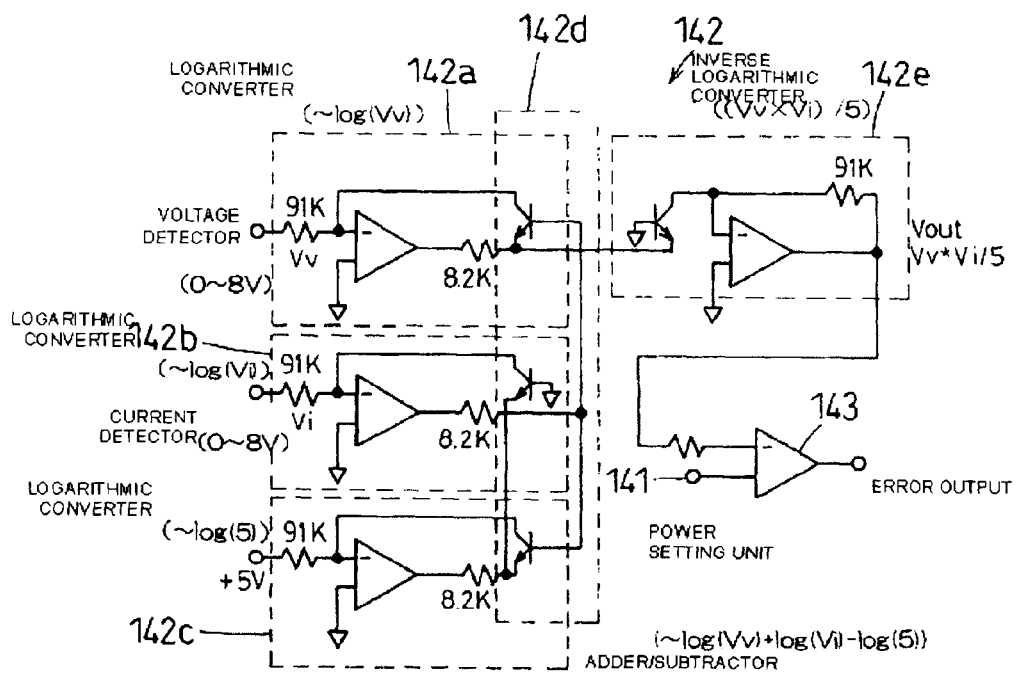
FIG. 7 is a circuit diagram of an example of the power determination unit shown in FIG. 4.
Figure 8:
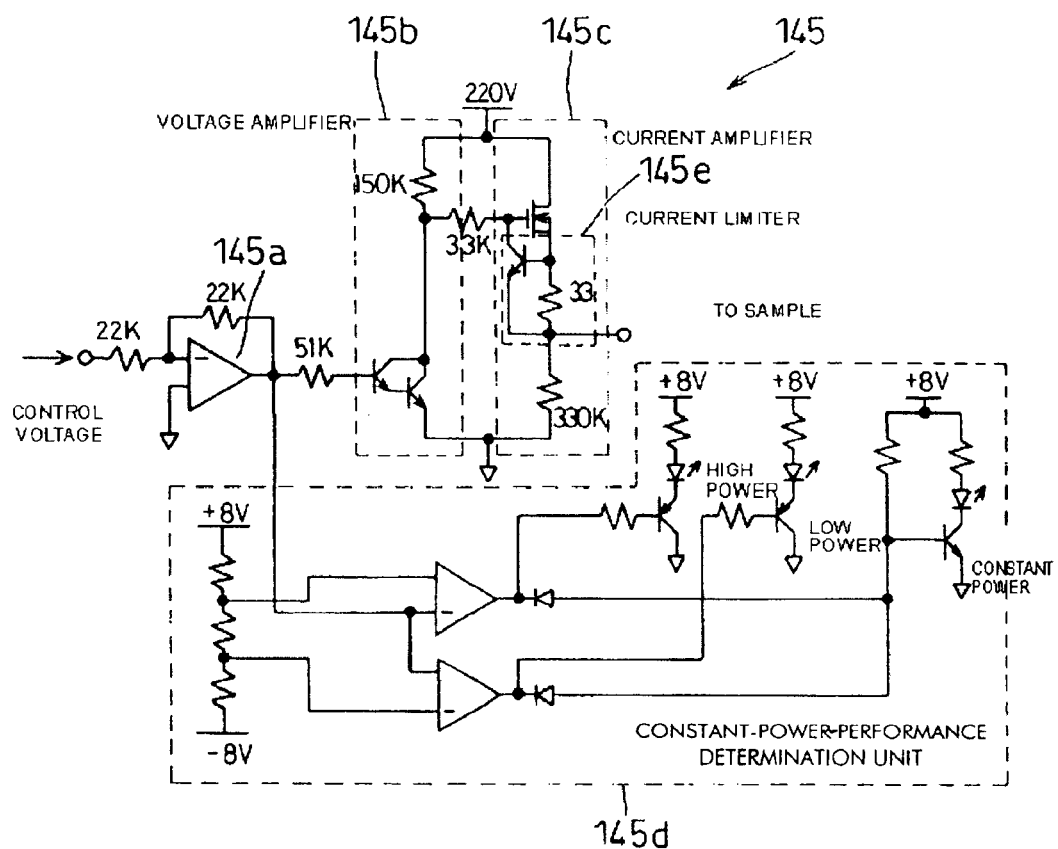
FIG. 8 is a circuit diagram of an example of the power amplifier shown in FIG. 4.

An electronic component production method according to an embodiment of the present invention is described with reference to FIGS. 1 through 8. FIG. 1 is a block diagram of a burn-in apparatus 10 for performing the production method, FIG. 2 is a flowchart showing the operation of the burn-in apparatus 10, FIG. 3 is a graph showing a change in temperature of an electronic component, FIG. 4 is a circuit diagram of a constant-power applying unit as shown in FIG. 1, FIG. 5 is a circuit diagram of a current detector as shown in FIG. 4, FIG. 6 is a circuit diagram of a voltage detector as shown in FIG. 4, FIG. 7 is a circuit diagram of a power determination unit as shown in FIG. 4, and FIG. 8 is a circuit diagram of a power amplifier as shown in FIG. 4.

The burn-in apparatus 10 includes a heater/thermostat 12, a constant-power applying unit 14, a probing unit 16, a burn-in controller 18, and a burn-in condition setting unit 20.

The heater thermostat 12 has a casing structure with an internal space in which an electronic component 22 is accommodated at a predetermined burn-in position, and this casing structure is suitable for heating and thermostatic control. The heater thermostat 12 further includes a built-in heater/thermostat mechanism for the accommodated electronic component 22, such as a hot-air blowing mechanism or a hot plate.

The constant-power applying unit 14 applies constant power to the electronic component 22, and, in this embodiment, the constant power is 0.1 W. The constant power is all converted into heat for use in heating the electronic component 22.

The probing unit 16 connects the electronic component 22 located at the burn-in position to the constant-power applying unit 14, and has known thermal resistance, e.g., 200° C./W in this embodiment.

The burn-in controller 18 controls the operation of the heater thermostat 12 and the constant-power applying unit 14. More specifically, the burn-in controller 18 executes first and second control steps. In the first control step, the burn-in controller 18 drives the heater thermostat 12 to heat the electronic component 22 to a predetermined temperature, e.g., 95° C., and, after this heating operation, further drives the constant-power applying unit 14 to apply the constant power to the electronic component 22 so that the temperature of the electronic component 22 increases from the predetermined temperature, i.e., 95° C., to a burn-in temperature of 115° C. In the second control step, the burn-in controller 18 measures a voltage applied to the electronic component 22 at the burn-in temperature (this voltage is referred to as the actual voltage), and compares the measured actual voltage with a prescribed burn-in voltage of 100 V; and based on the difference therebetween, calculates a corrected burn-in time based on the prescribed burn-in time by calculating [(burn-in voltage)$^A$/(actual voltage)$^A$]× prescribed burn-in time to determine the corrected burn-in time. In this example, the electronic component 22 is subjected to burn-in at the burn-in temperature of 115° C. for the corrected burn-in time. In the above formula, A denotes the acceleration factor indicating how the load applied to the electronic component 22 increases depending upon voltage, and is determined using a life test or the like. In this embodiment, A=2.

In this embodiment, the actual voltage is 140 V, the burn-in voltage is 100 V, and the prescribed burn-in time is 10 minutes (or 600 seconds). Therefore, the corrected burn-in time is approximately 306 seconds, which is about one-half of the prescribed burn-in time, i.e., 600 seconds.

The operation of the burn-in apparatus 10 is described with reference to FIGS. 2 and 3.

In step n1, burn-in conditions of the electronic component 22 are set and input to the burn-in controller 18 from the burn-in condition setting unit 20. In this embodiment, it is assumed that the prescribed burn-in temperature is 115° C., the burn-in voltage is 100 V, the burn-in time is 10 minutes (or 600 seconds), and the acceleration factor A of the load applied to the electronic component 22 with respect to voltage is 2.

In step n2, the electronic component 22 is placed in the heater thermostat 12 at a predetermined burn-in position.

In step n3, the burn-in controller 18 controls the heater thermostat 12 to heat the electronic component 22 to a predetermined temperature, e.g., 95° C., which is the burn-in temperature or less, as defined in the burn-in conditions.

In step n4, the burn-in controller 18 determines whether or not the ambient temperature of the electronic component 22 has reached the predetermined temperature, i.e., 95° C. If YES is obtained in step n4, the process proceeds to step n5.

In step n5, the burn-in controller 18 controls the heater thermostat 12 so as not to heat the electronic component 22 further and to transition to a thermostatic mode.

In step n6, the burn-in controller 18 drives the constant-power applying unit 14 to apply a constant power of 0.1 W to the electronic component 22. Due to the applied constant power, the electronic component 22 is self-heated, and the temperature of the electronic component 22 increases by 20° C., which corresponds to the thermal resistance (200° C./W) of the probing unit 16 and the constant power (0.1 W). The temperature increase of the electronic component 22 is shown in FIG. 3. In FIG. 3, the x-axis represents time and the y-axis represents temperature. In the period Tr, the electronic component 22 is heated by 20° C. from 95° C. The period Tm corresponds to a corrected burn-in time described below. As shown in FIG. 3, after the constant power has been applied to cause the electronic component 22 to be self-heated, the temperature of the electronic component 22 is then maintained stable at a certain temperature, that is, the burn-in temperature of 115° C.

The electronic component 22 is heated to 95° C. by the heater thermostat 12 and is further heated by 20° C. due to the applied constant power, including self-heating, and, consequently, is maintained at the burn-in temperature.

If the burn-in controller 18 determines in step n7 that the temperature of the electronic component 22 has reached 115° C., the process proceeds to step n8 and the following steps, in which the other burn-in conditions including voltage and time setting are determined.

In step n8, the burn-in controller 18 measures the voltage (actual voltage) applied to the electronic component 22. The actual voltage may be measured either directly or via the constant-power applying unit 14. In step n9, the burn-in controller 18 compares the measured actual voltage with the prescribed burn-in voltage since the load is proportional to the square of the voltage, and corrects the prescribed burn-in time based on the difference therebetween according to the following equation (1):

$$Tm = (Vm^2/Vb^2) \times Tb \qquad \text{Eq. (1)}$$

where Tm denotes the corrected burn-in time, Vm denotes the actual voltage applied to the electronic component 22, Vb denotes the prescribed burn-in voltage, and Tb denotes the prescribed burn-in time.

In step n10, the corrected burn-in time Tm starts, and the constant power is continuously applied until the corrected burn-in time Tm terminates in step n11. When the corrected burn-in time Tm terminates, then in step n12, application of the constant power stops, and the burn-in process ends.

In the burn-in operation of the embodiment, the burn-in temperature condition for the electronic component 22 can correctly be determined, and the total load applied to the electronic component 22 can be controlled. An accurate burn-in test can therefore be performed on any electronic component 22.

The structure of the constant-power applying unit 14 is specifically described with reference to FIGS. 4 through 6. The constant-power applying unit 14 includes a power setting unit 141 for outputting a set power signal corresponding to the constant power P in response to an input of a signal for setting a constant power P from the burn-in condition setting unit 20; a power determination unit 142 for determining the power being used in the electronic component 22; an error amplifier 143 for amplifying an error between the set power signal from the power setting unit 141 and the determined power signal from the power determination unit 142; a power amplifier 145 for amplifying the output power from the error amplifier 143; a current detector 146 for detecting a current flowing in the electronic component 22; and a voltage detector 147 for detecting a voltage applied to the electronic component 22. The power determination unit 142 determines the power being used in the electronic component 22 from the detected current from the current detector 146 and the detected voltage from the voltage detector 147, and outputs the determined value as the above-noted determined power signal. A driver 144 receives the output of the error amplifier 143 and illuminates an LED (FIG. 4) when the set power signal equals the determined power signal.

Although a detailed description is not given, as shown in FIG. 5, the current detector 146 detects a current I flowing in the electronic component 22 using resistance, and outputs a voltage Vi proportional to the detected current value. Although a detailed description is not given, as shown in FIG. 6, the voltage detector 147 divides the voltage V applied to the electronic component 22 by the resistance, and outputs a voltage Vv proportional to the resulting voltage value.

The power determination unit 142 is shown in FIG. 7. The power determination unit 142 includes a first logarithmic converter 142a for logarithmically converting the voltage Vv from the voltage detector 147 into log (Vv); a second logarithmic converter 142b for logarithmically converting the voltage Vi from the current detector 146 into log (Vi); a third logarithmic converter 142c for logarithmically converting a voltage of 5 V into log (5); an adder/subtractor 142d for adding and subtracting the outputs of the first through third logarithmic converters 142a through 142c, that is, calculating [log (Vv)+log (Vi)−log (5)]; and an inverse logarithmic converter 142e for inversely logarithmically converting the output of the adder/subtractor 142d into [Vv×Vi/5].

The power determination unit 142 is an analog calculator using a logarithmic relation between the base-emitter voltage and the corrector current of a transistor, and outputs a voltage Vout (=Vv×Vi/5) in response to the input voltages Vi and Vv.

The power amplifier 145 is shown in FIG. 8. The power amplifier 145 includes a buffer 145a to which a control voltage corresponding to the determined power from the burn-in controller 18 is applied, a voltage amplifier 145b, a current amplifier 145c, and a constant-power-performance determination unit 145d.

The current amplifier 145c includes a current limiter 145e. The power amplifier 145 amplifies the output of the error amplifier 143 so that a high current and a high voltage can be applied to the electronic component 22. The power amplifier 145 is used because a high current and a high voltage cannot be handled in a circuit such as the error amplifier 143. More specifically, the output voltage of the error amplifier 143 is amplified by a transistor, and the resulting voltage flows to a field-effect transistor (FET) source follower, which provides a high current. The current limiter 145e limits a current over a certain value to prevent a circuit burnout caused by an excessive current flowing therein when the electronic component 22 is short-circuited.

It is to be understood that the present invention is not limited to the foregoing embodiment and a variety of modifications or adaptations may be made.

Figure 9:
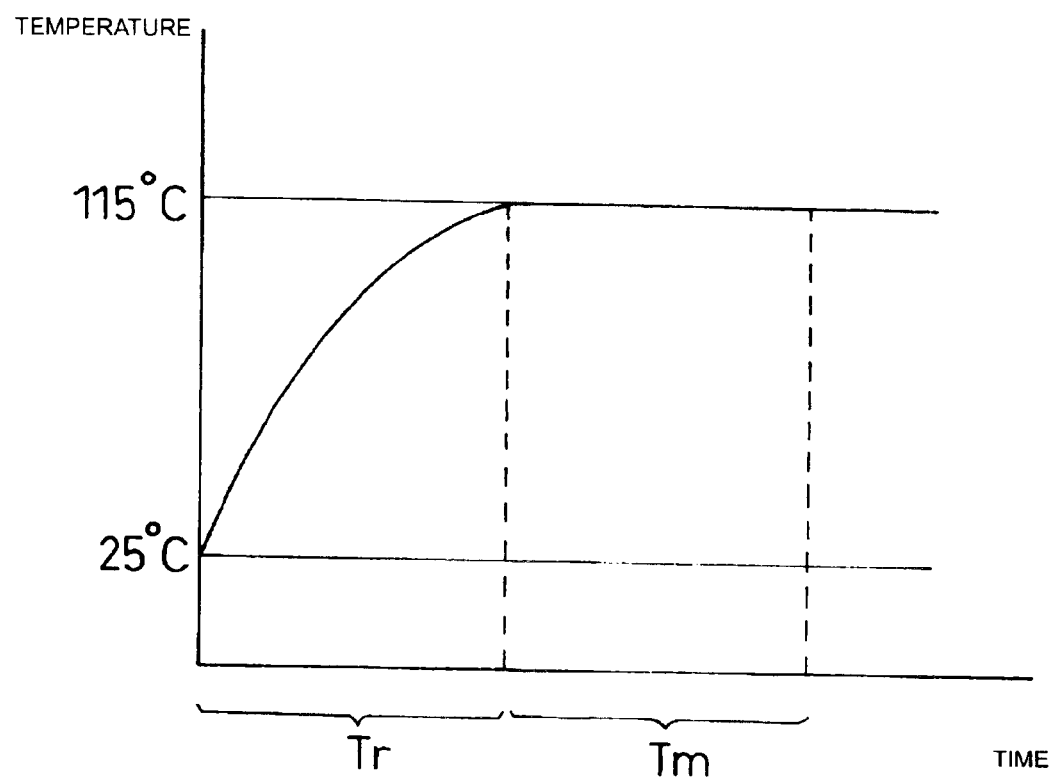
FIG. 9 is a graph showing a change in temperature of an electronic component in an electronic component production method according to another embodiment of the present invention.

FIG. 9 shows a modified embodiment. The heater thermostat 12 employed in the illustrated embodiment is not essential. If the heater thermostat is not used, the electronic component 22 is maintained at a normal temperature. In such a case, for example, assuming that the thermal resistance of the probing unit 16 is 200° C./W, the normal temperature 25° C., and the burn-in temperature 115° C., then, the constant-power applying unit 14 should apply a power of 0.45 W to the electronic component 22 as the constant power P, to obtain a temperature rise of 115° C.–25° C.=90° C. FIG. 9 shows a temperature increase of the electronic component 22 to which this constant power is applied by the constant-power applying unit 14.

The burn-in controller 18 may be implemented by a microcomputer controlled by software processing. In this case, a program for executing the flowchart shown in FIG. 2 is installed in the microcomputer.

Although the present invention has been described in relation to particular embodiments thereof, many other variations and modifications and other uses will become apparent to those skilled in the art. Therefore, the present invention is not limited by the specific disclosure herein.

What is claimed is:

1. An electronic component production method for subjecting an electronic component to burn-in, in which a load equivalent to a predetermined load defined by a burn-in temperature, a burn-in voltage, and a prescribed burn-in time is applied to the electronic component, said electronic component production method comprising:
   a first step of maintaining the temperature of the electronic component at a predetermined temperature which is lower than the burn-in temperature;
   a second step of applying constant power to the electronic component to increase the temperature of the electronic component from the predetermined temperature to the burn-in temperature; and
   a third step of comparing an actual voltage which is applied to the electronic component at the burn-in temperature with the burn-in voltage, and correcting the prescribed burn-in time based on the difference therebetween to determine a corrected burn-in time, and applying the constant power to the electronic component for the corrected burn-in time.

2. An electronic component production method according to claim 1, wherein, in the second step, the constant power is applied to the electronic component via a probing unit having known thermal resistance and the applied constant power is defined so that the difference between the burn-in temperature and the predetermined temperature matches the product of the thermal resistance and the constant power.

3. An electronic component production method according to claim 1, wherein, in the third step, the corrected burn-in time is given by [(the burn-in voltage)$^A$/(the actual voltage)$^A$]×the burn-in time, where A is a constant.

4. An electronic component production method according to claim 3, wherein, in the first step, the predetermined temperature is higher than a normal temperature and the electronic component is first heated from the normal temperature to the predetermined temperature and then maintained at the predetermined temperature.

5. An electronic component production method according to claim 3, wherein, in the second step, the constant power is applied to the electronic component via a probing unit having known thermal resistance and the applied constant power is defined so that the difference between the burn-in temperature and the predetermined temperature matches the product of the thermal resistance and the constant power.

6. An electronic component production method according to claim 1, wherein, in the first step, the predetermined temperature is higher than a normal temperature and the electronic component is first heated from the normal temperature to the predetermined temperature and then maintained at the predetermined temperature.

7. An electronic component production method according to claim 6, wherein, in the second step, the constant power is applied to the electronic component via a probing unit having known thermal resistance and the applied constant power is defined so that the difference between the burn-in temperature and the predetermined temperature matches the product of the thermal resistance and the constant power.

8. An electronic component production method according to claim 7, wherein, in the third step, the corrected burn-in time is given by [(the burn-in voltage)$^A$/(the actual voltage)$^A$]×the burn-in time, where A is a constant.

9. A burn-in apparatus for subjecting an electronic component to burn-in, in which a load equivalent to a predetermined load defined by a burn-in temperature, a burn-in voltage, and a prescribed burn-in time is applied to the electronic component, said burn-in apparatus comprising:
   a constant-power applying unit for applying constant power to the electronic component; and
   a burn-in control unit for controlling the operation of the constant-power applying unit,
   wherein the burn-in control unit executes at least a first control step of driving the constant-power applying unit to apply the constant power to the electronic component to increase the temperature of the electronic component from a predetermined temperature to the burn-in temperature, and a second control step of comparing an actual voltage which is applied to the electronic component at the burn-in temperature with the burn-in voltage, and correcting the prescribed burn-in time based on the difference therebetween, so that the electronic component is subjected to burn-in at the burn-in temperature for the corrected burn-in time.

10. A burn-in apparatus according to claim 9, further comprising a probing unit having known thermal resistance, wherein the constant power is applied to the electronic component via the probing unit, and the applied constant power is defined so that the difference between the burn-in temperature and the predetermined temperature matches the product of the thermal resistance and the constant power.

11. A burn-in apparatus according to claim 10, wherein, in the second control step, the burn-in control unit calculates [(the burn-in voltage)$^A$/(the actual voltage)$^A$]×the burn-in time, where A denotes a constant, to determine the corrected burn-in time, and the electronic component is subjected to burn-in for the corrected burn-in time.

12. A burn-in apparatus according to claim 9, wherein, in the second control step, the burn-in control unit calculates [(the burn-in voltage)$^A$/(the actual voltage)$^A$]×the burn-in time, where A denotes a constant, to determine the corrected burn-in time, and the electronic component is subjected to burn-in for the corrected burn-in time.

* * * * *